United States Patent
Tomita

[11] Patent Number: 5,859,865
[45] Date of Patent: Jan. 12, 1999

[54] SEMICONDUCTOR LASER

[75] Inventor: Akihisa Tomita, Tokyo, Japan

[73] Assignee: NEC Corporation, Tokyo, Japan

[21] Appl. No.: 823,040

[22] Filed: Mar. 21, 1997

[30] Foreign Application Priority Data

Mar. 21, 1996 [JP] Japan .................................. 8-064162

[51] Int. Cl.[6] ..................................................... H01S 3/19
[52] U.S. Cl. .............................................................. 372/45
[58] Field of Search ................................ 372/45, 44, 46; 257/14, 22, 94, 96, 97

[56] References Cited

U.S. PATENT DOCUMENTS 5,745,517  4/1998  Bour et al. ................................. 372/45
5,757,835  5/1998  Ono et al. .................................. 372/45

OTHER PUBLICATIONS

T. Tanaka et al., "Lasing Operation Up to 200 K in the Wavelength Range of 570–590 nm by GaInP/AlGaInP Double–Heterostructure Laser Diodes on GaAsP Substrates", Appl. Phys. Lett., vol. 66, No. 7, Feb. (1995), pp. 783–785.

H. Kressel et al., "Red–Emitting Ga(As,P)/(In,Ga)P Heterojunction Lasers", J. Appl. Phys., vol. 49, No. 6, Jun. (1978), pp. 3140–3149.

Primary Examiner—James W. Davie
Attorney, Agent, or Firm—Foley & Lardner

[57] ABSTRACT

A semiconductor laser includes a substrate and an active layer. The substrate has a lattice constant which falls within the range between 0.565 nm and 0.56 nm. The active layer has a quantum well structure in which a GaInP alloy crystal with a lattice constant larger than the lattice constant of the substrate is formed as a well layer and an AlGaInP alloy crystal with a lattice constant smaller than the lattice constant of the substrate is formed as a barrier layer.

5 Claims, 4 Drawing Sheets

SEMICONDUCTOR LASER

BACKGROUND OF THE INVENTION

1. Field of the Invention

The present invention relates to a semiconductor laser used as a light source for optical information processing.

2. Description of the Prior Art

Long-service-life semiconductor lasers with small changes in threshold current upon changes in temperature are required as light sources for optical information processing. To prolong the service life, it is effective to decrease the threshold current of a laser. For these reasons, semiconductor lasers having quantum well structures as active layers are used as the light sources. In particular, a strained quantum well structure in which a semiconductor constituting a well layer having a lattice constant different from that of a substrate has been known to be effective.

The reliability of a laser is improved by shifting the lattice constant of a barrier layer in a direction opposite to a well layer, and compensating the strain of the whole quantum well.

To increase the information storage capacity of optical disks and the like, short-wavelength lasers are required. Such a laser can be attained by using GaAsP with a lattice constant smaller than that of conventional GaAs for a substrate, which is reported in H. Kressel, C. J. Nuesse, and G. H. Olsen, "Journal of Applied Physics", Vol. 49, pp. 3140–3149, 1978, and T. Tanaka, K. Uchida, Y. Ishitani, and S. Minagawa "Applied Physics Letters", Vol. 66, pp. 783–785, 1995. In these references, the wavelength of an active layer lattice-matched with a substrate is shortened by utilizing a semiconductor crystal with a small lattice constant having a large band gap.

When the characteristics of a semiconductor laser for emitting a beam with wavelength around 635 nm are improved by introducing the above-described strained quantum well structure into the semiconductor laser, the following problems arise.

First, in a compressive-strained quantum well structure wherein a well layer has a lattice constant higher than that of a substrate, a very thin well layer with a thickness of 1 to 2 nm must be formed to emit a beam around 635 nm because the band gap of the material for the well layer itself is small. Accordingly, the characteristics are degraded due to variations in thickness of the well layer in growth.

Second, in a tensile-strained quantum well wherein a well layer has a lattice constant smaller than that of a substrate, the well layer can be made thick because the band gap of the material for the well layer is large. However, carrier confinement is degraded because a difference in band gap with respect to a barrier layer becomes small. Leakage of carriers from an active layer degrades the threshold current and temperature characteristics. Particularly in a strain compensation structure wherein a compressive strain is applied to a barrier layer, almost no potential barrier with respect to electrons exists between a well layer and the barrier layer, resulting in an increase in leakage current.

Third, if the Al composition of AlGaInP serving as a barrier layer is increased in order to increase a band gap between the well and barrier layers, the band structure changes to be of an indirect transition type. For this reason, energy at the X point decreases to increase leakage carriers passing through the X point.

As described above, many problems arise in forming a 630-nm-band laser with a strained quantum well active layer, and the performance is difficult to improve.

Next, the problems of a semiconductor laser using a strain compensated tensile-strained quantum well for compensating the strain of the whole quantum well by shifting the lattice constant of a barrier layer in a direction opposite to that of a well layer will be described in detail.

FIG. 1A is a schematic view showing a semiconductor laser using a strain compensated tensile-strained quantum well. A cladding layer 12, a guide layer 13, an active layer 14, a guide layer 15, and a cladding layer 16 are sequentially stacked on a substrate 11.

As materials for the respective layers, GaAs is used for the substrate 11; $(Al_{0.7}Ga_{0.3})_{0.5}In_{0.5}P$ lattice-matched with the substrate, for the cladding layers 12 and 16; $(Al_{0.5}Ga_{0.5})_{0.5}In_{0.5}P$ lattice-matched with the substrate, for the guide layers 13 and 15; and $Ga_{0.64}In_{0.36}P$ with a strain of 0.93% and $Al_{0.42}In_{0.58}P$ with a strain of -0.7%, respectively, for a well layer 141 and a barrier layer 142 in the quantum well structure of the active layer 14.

FIG. 1B is a diagram of the conduction band edge showing energy at the Γ points and energy at the X points of the respective layers from the well layer to the cladding layer in the semiconductor laser using the strain compented tensile-strained quantum well.

With the materials used in FIG. 1A, the energy of electrons at the Γ point of the well layer 141, and the energy of electrons at the Γ points of the barrier layer 142 and the guide layer 13 have almost no difference, as shown in FIG. 1B. Only the cladding layer 12 has an energy difference of 30 meV. Therefore, the quantum well effect cannot be expected, and a leakage current is very large.

Further, energy differences between the Γ point of the well layer 141 and the X points of the barrier layer 142 and the cladding layer 12 are only 110 meV, and the number of leakage carriers passing through the X points is large. For this reason, if the Al compositions of the barrier layer 142, the guide layer 13, and the cladding layer 12 are increased to make energy differences at the Γ points large, energy at the X points decreases, resulting in further increases in leakage carriers passing through the X points. Therefore, the overflow of carriers cannot be prevented.

As described above, when a 630-nm-band laser is formed with the tensile-strained quantum well active layer, the performance is difficult to improve because the size of the strain cannot be increased.

When the wavelength is shortened by using GaAsP with a lattice constant smaller than that of a conventional GaAs substrate, the composition of a GaInP active layer to be lattice-matched becomes close to GaP. For this reason, leakage carriers from the X point increase, and the characteristics cannot be improved. Therefore, it is limited to shorten the wavelength by decreasing the lattice constant of the substrate.

SUMMARY OF THE INVENTION

The present invention has been made in consideration of the above situation, and has as one of its objects to provide a red-emitting semiconductor laser with a low threshold current by realizing a strained quantum well structure with good electron confinement.

To achieve the above object, according to the first aspect of the present invention, there is provided a semiconductor laser comprising a substrate having a lattice constant which falls within a range between 0.565 nm and 0.56 nm, and an active layer having a quantum well structure in which a GaInP alloy crystal with a lattice constant larger than the lattice constant of the substrate is formed as a well layer and an AlGaInP alloy crystal with a lattice constant smaller than the lattice constant of the substrate is formed as a barrier layer.

To achieve the above object, according to the second aspect of the present invention, there is provided a semiconductor laser comprising a substrate, a buffer layer stacked on the substrate and having a lattice constant at an uppermost portion which falls within a range between 0.565 nm and 0.56 nm, and an active layer having a quantum well structure in which a GaInP alloy crystal with a lattice constant larger than the lattice constant at the uppermost portion of the buffer layer is formed as a well layer and an AlGaInP alloy crystal with a lattice constant smaller than the lattice constant at the uppermost portion of the buffer layer is formed as a barrier layer.

According to the present invention having the above aspects, a strained quantum well structure with good electron confinement can be realized, and a red-emitting semiconductor laser with a low threshold current can be provided.

The above and other advantages, features and additional objects of the present invention will become manifest to those versed in the art upon making reference to the following detailed description and accompanying drawings in which preferred embodiments incorporating the principle of the present invention are shown by way of illustrative example.

DETAILED DESCRIPTION OF PREFERRED EMBODIMENTS

Preferred embodiments of the present invention will be described below with reference to the accompanying drawings.

Figure 1A:
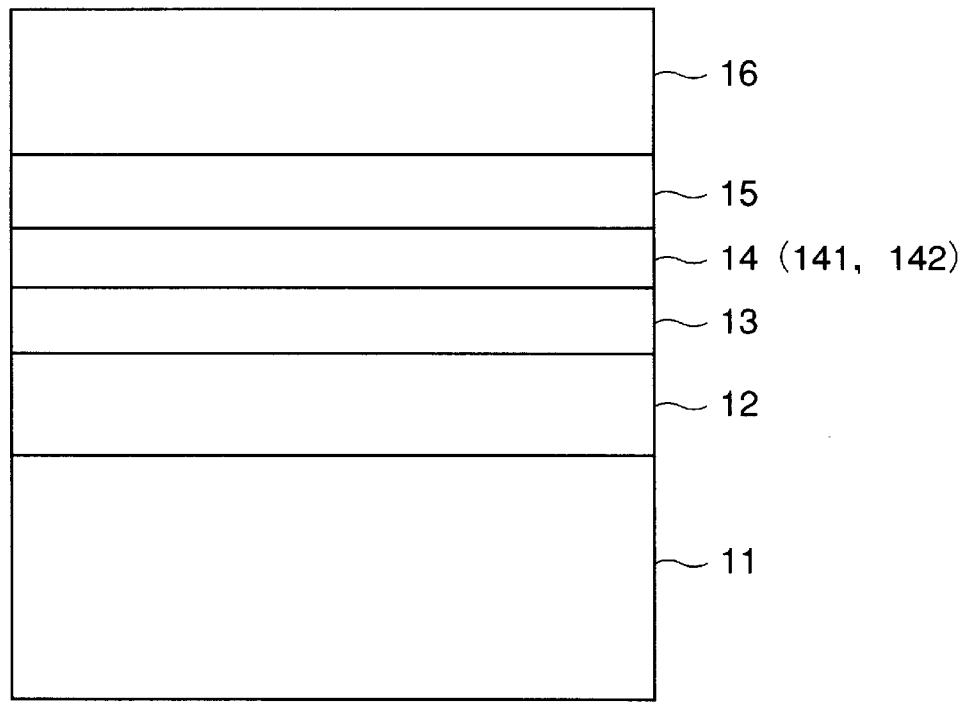
FIGS. 1A and 1B are explanatory views showing the layer structure of a conventional strain compensation type tensile-strained quantum well laser, and the band structure of the conduction band, respectively.
Figure 1B:
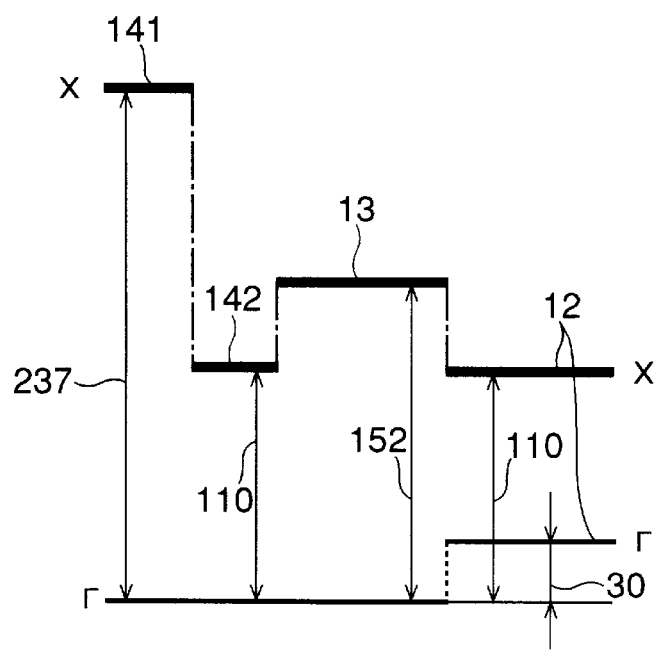
Figure 2A:
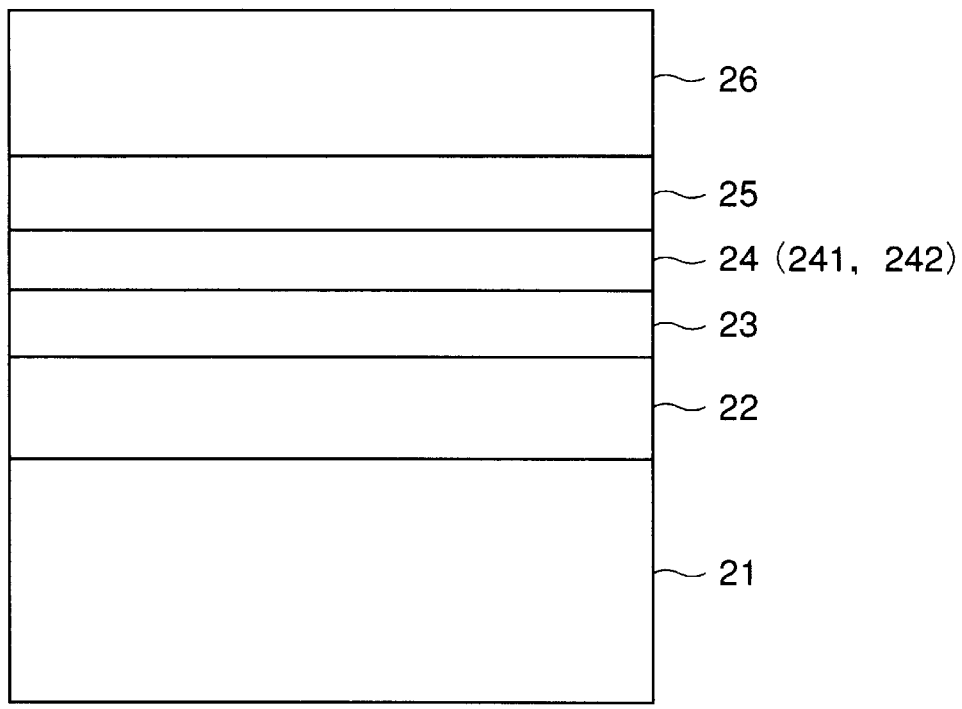
FIGS. 2A and 2B are explanatory views showing a layer structure and the band structure of the conduction band in the first embodiment of the present invention, respectively.
Figure 2B:
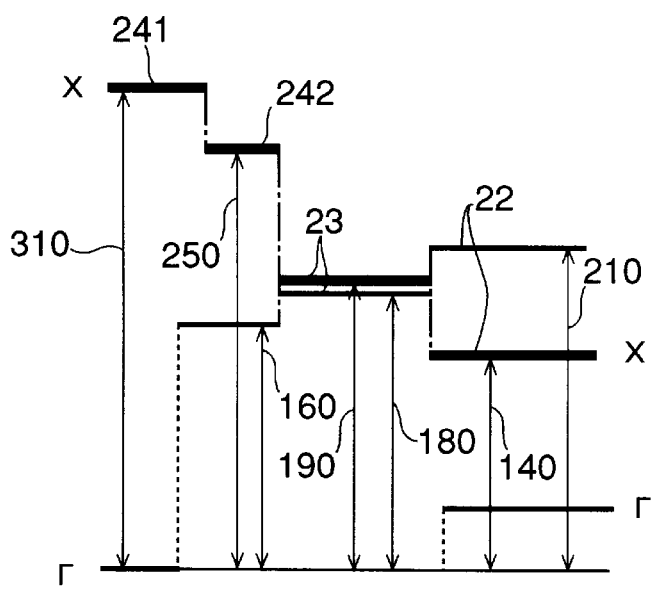

FIGS. 2A and 2B are band diagrams showing the layer structure and conduction band of the first embodiment to which the present invention is applied.

FIG. 2A is a schematic view showing a semiconductor laser according to the first embodiment. A cladding layer 22, a guide layer 23, an active layer 24, a guide layer 25, and a cladding layer 26 are sequentially stacked on a substrate 21.

As materials for the respective layers, $GaAs_{0.835}P_{0.165}$ with a lattice constant of 0.562 nm is used for the substrate 21; $(Al_{0.7}Ga_{0.3})_{0.6}In_{0.4}P$ lattice-matched with the substrate 21, for the cladding layers 22 and 26; and $Ga_{0.46}In_{0.54}P$ with a compressive strain of −1% and $(Al_{0.1}Ga_{0.9})_{0.66}In_{0.34}P$ with a tensile strain of 0.5%, for a well layer 241 and a barrier layer 242 in a quantum well structure which constitute the active layer 24. The band-gap energy of the well layer in the first embodiment is 1.9 eV.

In the first embodiment of the present invention, the band gap is large because the lattice constant of the quantum well structure is small. Accordingly, the well width of the compressive-strained quantum well can be set to about 5 nm. The influence of variations in well layer in growth can be reduced to avoid degradation in characteristics.

FIG. 2B is a diagram showing the conduction band edge from the well layer to the cladding layer in the semiconductor laser according to the first embodiment of the present invention. In the structure shown in FIG. 2B, energy differences from the $\Gamma$ point of the well layer to the $\Gamma$ points of the barrier layer, the guide layer, and the cladding layer are 160 meV, 180 meV, and 210 meV, respectively. Sufficient confinement can be expected.

Energy differences from the $\Gamma 0$ point of the well layer to the X points of the well layer, the barrier layer, the guide layer, and the cladding layer are 310 meV, 250 meV, 190 meV, and 140 meV, respectively. Leakage of electrons passing through the X points can also be suppressed.

Figure 3:
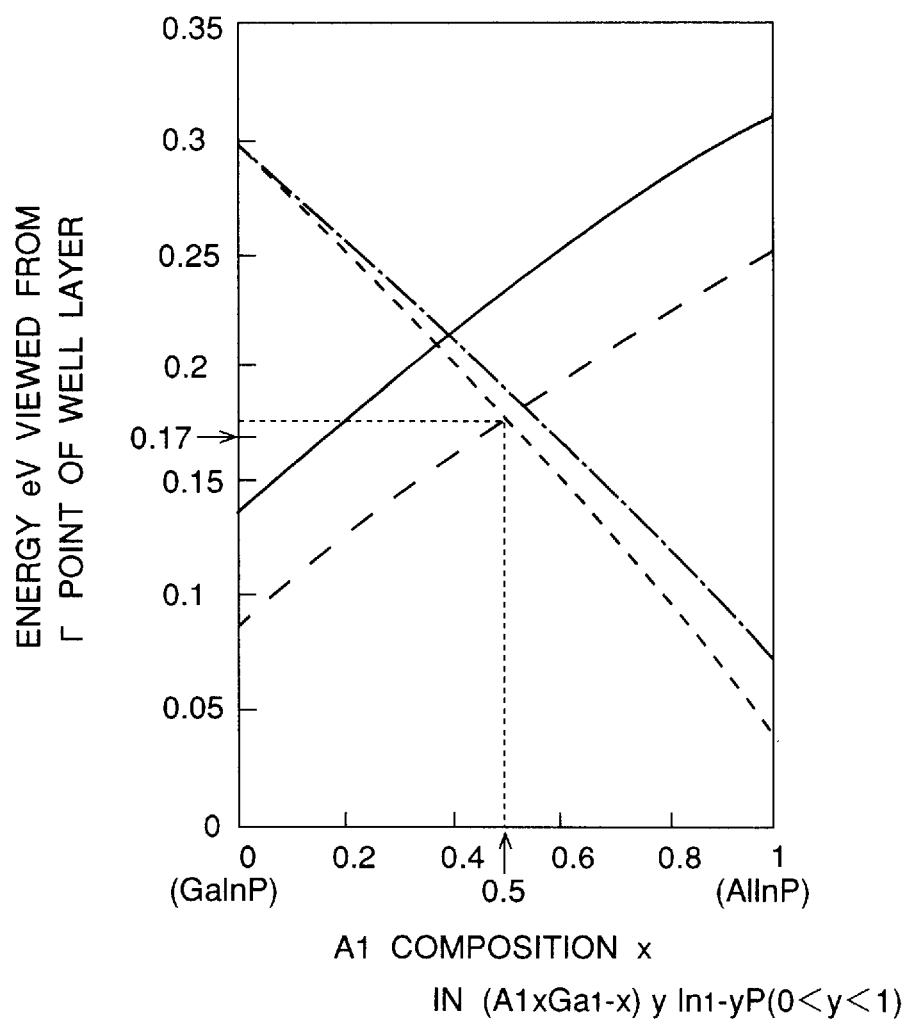
FIG. 3 is a graph showing the relationship between the Al composition and energy at $\Gamma$ and X points of AlGaInP when viewed from the $\Gamma$ point of a well layer in the embodiment shown in FIGS. 2A and 2B.

FIG. 3 is a graph showing the electron energy of AlGaInP when viewed from the $\Gamma 0$ point of the well layer.

A solid line in FIG. 3 represents energy at the $\Gamma 0$ point of AlGaInP when strain compensation is performed; a dotted line, energy at the X point of AlGaInP when strain compensation is performed; a broken line, energy at the $\Gamma 0$ point of AlGaInP lattice-matched with the substrate; and a chain line, energy at the X point of AlGaInP.

When the Al composition x in $(Al_xGa_{1-x})_yIn_{1-y}P$ (0<y<1) is changed from 0 to 1, the energy difference between the $\Gamma$ points increases, while energy at the X point decreases. To negligibly decrease leakage of carriers passing through the X point of the barrier layer in the quantum well structure, the number of electrons present at the X point must be sufficiently smaller than that of electrons present at the $\Gamma$ point of the well layer. If this ratio is 1/10, a leakage current passing through the X point is negligible in practical use.

To set an isotopic abundance of electrons at the $\Gamma$ point and those at the X point in an equilibrium state to 10:1, an energy difference between electrons at the $\Gamma$ point and those at the X point must be 170 meV. Therefore, under the conditions for the substrate and the well layer used in the first embodiment, the Al composition x in $(Al_xGa_{1-x})In_{1-y}P$ (0<y<1) is sufficiently 0.5 or less. At this time, the quantum well effect is not lost because an energy difference between the $\Gamma$ points of the well layer and the barrier layer is also 100 meV or more.

When the lattice constant of the substrate is further decreased to 0.56 nm or smaller, an energy difference between the $\Gamma$ and X points decreases, and the composition of the AlGaInP layer does not satisfy the above conditions. For this reason, the lattice constant of the substrate must be set to 0.56 nm or larger.

According to the first embodiment, a strained quantum well structure with good electron confinement can be realized, and a red-emitting semiconductor laser with a low threshold current can be provided.

Next, the second embodiment of the present invention will be described with reference to FIGS. 4A and 4B. The first embodiment has exemplified the structure using the substrate whose lattice constant falls within the range of 0.565 to 0.56 nm. The second embodiment exemplifies a case using another substrate.

Figure 4A:
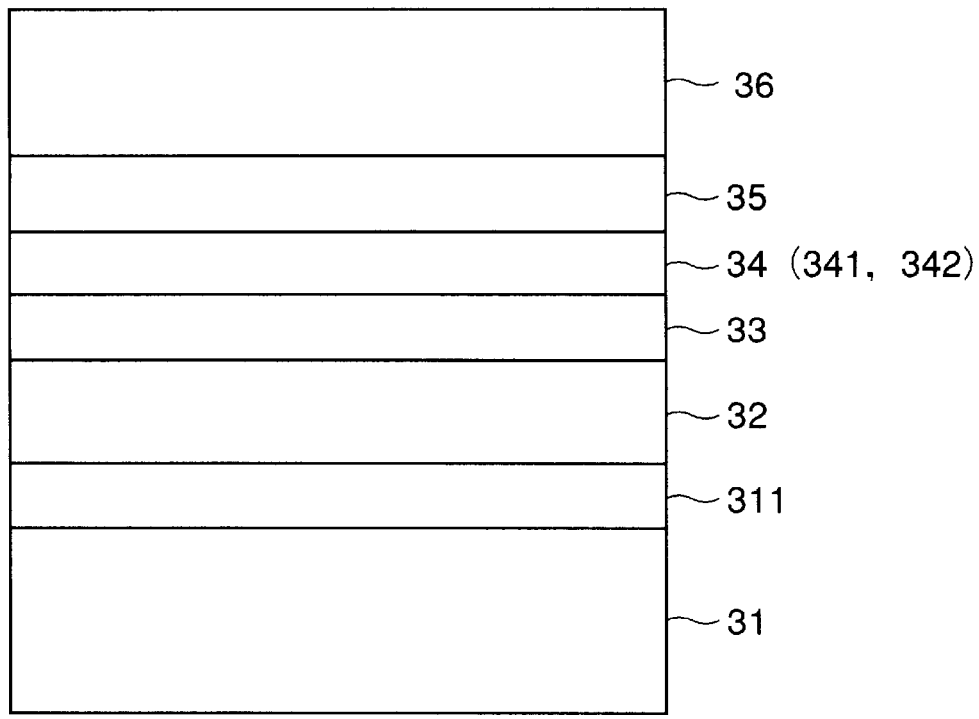
FIGS. 4A and 4B are explanatory views showing a layer structure and the band structure of the conduction band in the second embodiment of the present invention, respectively.

FIG. 4A is an explanatory view showing a layer structure according to the second embodiment of the present invention. Si is used for a substrate 31, on which a buffer layer 311 having a composition gradually changed from GaP to $GaAs_{0.835}P_{0.165}$ is grown to a thickness of 1 μm. On the buffer layer 311, a cladding layer 32 consisting of $(Al_{0.7}Ga_{0.3})_{0.6}In_{0.4}P$ with a lattice constant of 0.562 nm, a guide layer 33 consisting of $(Al_{0.5}Ga_{0.5})_{0.6}In_{0.4}P$, an active layer 34 having a quantum well structure constituted by a well layer 341 of $Ga_{0.46}In_{0.54}P$ with a compressive strain of −1% and a barrier layer 342 of $(Al_{0.1}Ga_{0.9})_{0.66}In_{0.34}P$ with a tensile strain of 0.5%, a guide layer 35 consisting of $(Al_{0.5}Ga_{0.5})_{0.6}In_{0.4}P$, and a cladding layer 36 consisting of $(Al_{0.7}Ga_{0.3})_{0.6}In_{0.4}P$ are sequentially stacked.

In the second embodiment, the lattice constant of the $GaAs_{1-x}P_x$ alloy crystal buffer layer 311 formed on the substrate 31 is changed from the substrate side to the uppermost portion. The lattice constant of the buffer layer 311 is selected such that the lattice constant of the $GaAs_{1-x}P_x$ alloy crystal at the uppermost portion of the buffer layer 311 falls within the range between 0.565 nm and 0.56 nm when the substrate 31 side of the buffer layer 311 consists of GaP. In the second embodiment, the lattice constant of $GaAs_{1-x}P_x$ at the uppermost portion of the buffer layer 311 on the substrate is changed from the substrate side to be 0.562 nm. In the second embodiment, a strained quantum well structure with good electron confinement is realized without using a substrate having a specific lattice constant, unlike in the first embodiment. A red-emitting semiconductor laser with a low threshold current can be provided.

Although the second embodiment uses Si for the substrate, the material is not limited to Si, and another substrate such as, for example Ge, SiGe, etc., may be employed.

Figure 4B:
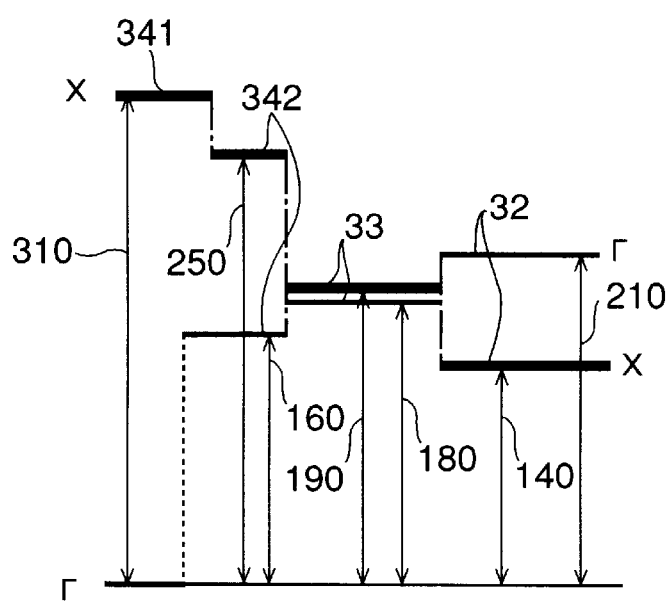

FIG. 4B is a band diagram showing a conduction band edge at this time. This conduction band is the same as that in the first embodiment, and good electron confinement can be obtained. Since the second embodiment uses Si for the substrate, a high-quality substrate can be obtained at low cost.

What is claimed is:

1. A semiconductor laser comprising: a substrate having a lattice constant which falls within a range between 0.565 nm and 0.56 nm; and an active layer having a quantum well structure in which a GaInP alloy crystal with a lattice constant larger than the lattice constant of said substrate is formed as a well layer and an AlGaInP alloy crystal with a lattice constant smaller than the lattice constant of said substrate is formed as a barrier layer.

2. The laser according to claim 1, wherein said substrate essentially consists of $GaAs_{0.835}P_{0.165}$, and said active layer includes a well layer essentially consisting of $Ga_{0.46}In_{0.54}P$ with a compressive strain of −1%, and a barrier layer essentially consisting of $(Al_{0.1}Ga_{0.9})_{0.66}In_{0.34}P$ with a tensile strain of 0.5%.

3. The laser according to claim 1, wherein an Al composition x in $(Al_xGa_{1-x})_yIn_{1-y}P$ (0<y<1) is not less than 0.5 as a condition for said substrate and said well layer.

4. The laser according to claim 1, wherein said substrate essentially consists of Si, said buffer layer has a composition gradually changed from GaP to $GaAs_{0.835}P_{0.165}$, and said active layer includes a well layer essentially consisting of $Ga_{0.46}In_{0.54}P$ with a compressive strain of −1%, and a barrier layer essentially consisting of $(Al_{0.1}Ga_{0.9})_{0.66}In_{0.34}P$ with a tensile strain of 0.5%.

5. A semiconductor laser comprising: a substrate; a buffer layer stacked on said substrate and having a lattice constant at an uppermost portion which falls within a range between 0.565 nm and 0.56 nm; and an active layer having a quantum well structure in which a GaInP alloy crystal with a lattice constant larger than the lattice constant at the uppermost portion of said buffer layer is formed as a well layer and an AlGaInP alloy crystal with a lattice constant smaller than the lattice constant at the uppermost portion of said buffer layer is formed as a barrier layer.

* * * * *